DIODE-TRANSFORMER GATING CIRCUIT

Filed Nov. 28, 1958

INVENTOR.
KENNETH H. OLSEN
BY
Blair, Spencer & Buckles
ATTORNEYS

United States Patent Office 2,977,485
Patented Mar. 28, 1961

2,977,485

DIODE-TRANSFORMER GATING CIRCUIT

Kenneth H. Olsen, Bedford, Mass., assignor to Digital Equipment Corporation, Maynard, Mass.

Filed Nov. 28, 1958, Ser. No. 776,931
9 Claims. (Cl. 307—88.5)

Figure 1:
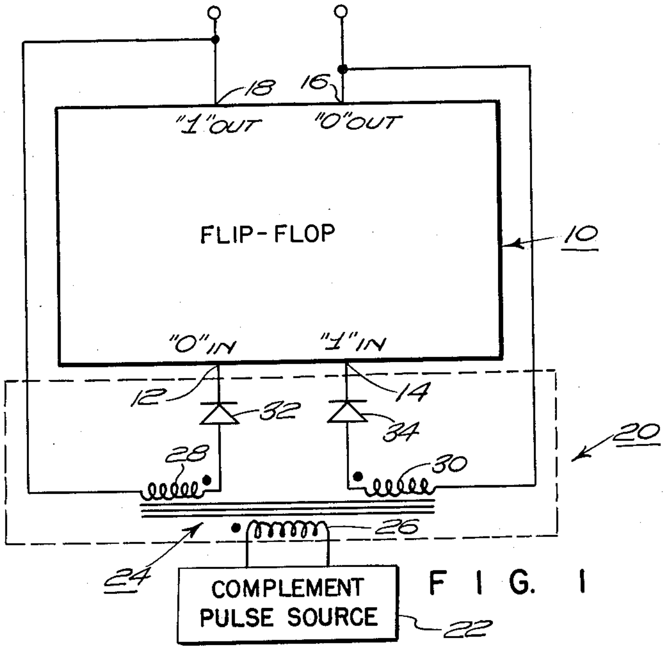

This invention relates to an improved high speed gating circuit adapted to control the passage of an electrical signal in the form of a pulse or the like. More particularly, it relates to a low cost gating circuit adapted to function in high speed digital data processing systems. The invention contemplates the use of a simple diode-transformer arrangement in which the gated signal is applied to the transformer primary; the output is taken from the secondary in series with a diode which may be biased to prevent transmission of the gated signal.

The invention is particularly useful in providing a complement input to a flip-flop circuit. In one form, a flip-flop may comprise a pair of transistors interconnected so that when one is conducting, the voltage at its output is applied to the input of the other transistor to cut off the latter, i.e., maintain it in a nonconducting state. In accordance with binary terminology, one of the transistors may be termed the Zero transistor and the other the One transistor. A signal in the form of a pulse may be applied to the flip-flop to render one of the transistors conducting, and it will remain in this state while maintaining the other transistor nonconducting, in the above manner, until the latter is similarly pulsed to reverse the conducting-nonconducting relationship. For the purpose of terminology, the flip-flop may be considered to be in the Zero state when the Zero transistor is conducting and in the One state when the One transistor is conducting. Also, the input to which a signal is applied to impose the Zero state on the flip-flop may be called the Zero input and the One label may be applied to the input which is pulsed to impose the One state.

In certain computer operations, it is desirable to reverse the conducting state of a flip-flop rather than place it in a predetermined one of the two states. Thus, if the circuit is in the Zero state, a pulse called a complement pulse is directed to the One input, and if the flip-flop is in the One state, the complement pulse is directed to the Zero input. Accordingly, a switching means responsive to the state of the flip-flop is required to direct the complement pulse to one or the other of the Zero and One inputs. This function is accomplished by a pair of gating circuits whose signal inputs are connected to the source of the complement pulse and whose outputs are connected to the Zero and One inputs of the flip-flop circuit. Each of the gates is controlled by the output signal from one of the transistors in such fashion that when the flip-flop is in the One state, the gate connected to the Zero input will be open to permit passage of the complement pulse to that input. Similarly, when the flip-flop is in the Zero state, the complement pulse will be conducted to the One input. Thus, no matter which state the flip-flop is in, the arrival of a complement pulse will transfer it to the other state.

Prior to my invention in high speed operations, the gating function in applications such as complement inputs to flip-flops was generally performed by a pair of transistors connected to function in the manner indicated above. The use of transistor gates involves a substantial element of cost, both for the acquisition of the transistors themselves and the fabrication of circuits incorporating them. It will be appreciated that this is a considerable item in a large data processing apparatus which may incorporate hundreds of such circuits. Moreover, the reliability of such apparatus is adversely affected by the addition of these gating transistors. However, their use has been justified by their speed of operation which is significantly greater than the other gating devices heretofore available.

Accordingly, it is a principal object of my invention to provide an improved high speed gating circuit adapted to control the transmission of electrical signals. In particular, the gating circuit is required to control the passage of pulses in digital data processing systems and the like. It is another object of my invention to provide a complement input for a flip-flop circuit which passes an input signal to the Zero or One input of the flip-flop depending on the conductive state of the latter circuit. A further object of the present invention is to provide a gating circuit of the above character which is reliable and yet easily fabricated from relatively low cost components. Other objects of the invention will in part be obvious and will in part appear hereinafter.

The invention accordingly comprises the features of construction, combination of elements, and arrangement of parts which will be exemplified in the construction hereinafter set forth, and the scope of the invention will be indicated in the claims.

Figure 2:
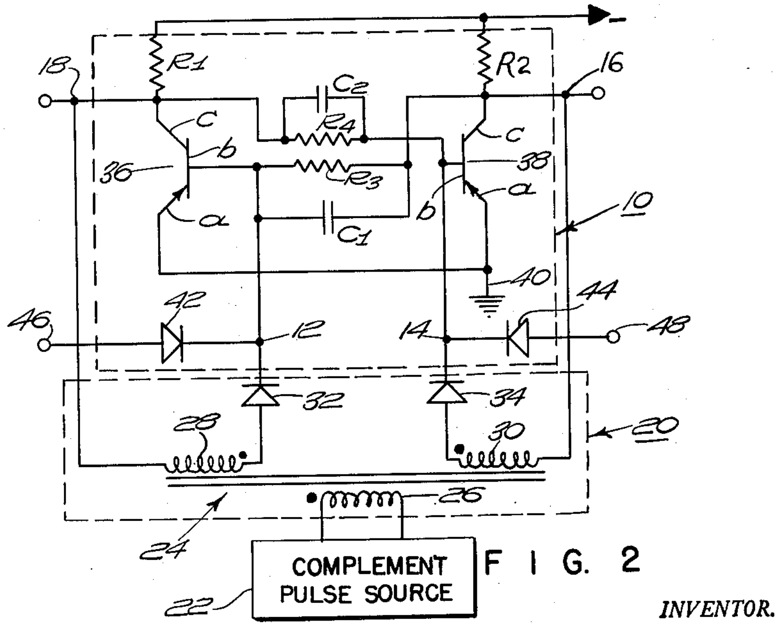

For a fuller understanding of the nature and objects of the invention, reference should be had to the following detailed description taken in connection with the accompanying drawing in which:

Figure 1 is a simplified schematic circuit diagram illustrating the operation of a gating circuit embodying the features of my invention when functioning as a complement input to a flip-flop circuit, and Figure 2 is a schematic circuit diagram illustrating in greater detail the circuit of Figure 1.

In general, my gating circuit makes use of a transformer in which the signal to be gated is applied to the primary winding and the gated output taken from a secondary. In the preferred embodiment, a diode is connected in series with one of the transformer windings, and the gating or control signal is applied in series with the diode and its associated winding, the polarity of the control signal being such as to apply a reverse bias to the diode, i.e., prevent conduction therethrough. With no control signal impressed on the circuit, the diode, which is connected to pass a signal of proper polarity to the output of the gating circuit, is unbiased and therefore passes the signal. When the control signal is applied, however, the diode is blocked and the signal is not passed. When the invention is used as a complement input for a flip-flop, two of the above gating circuits are provided with a common input connection for the gated complement pulse. The outputs of the gating circuits are connected to the flip-flop inputs and the control signals are derived from the flip-flop outputs for operation in the manner described. In one embodiment of the invention, the complement input utilizes a single transformer with one primary and two secondaries, and the diodes are connected in series with the respective secondary windings.

The use of my gating circuit has resulted in a substantial reduction in cost, both in materials and fabrication as compared with the prior transistor circuits. There is also an increase in reliability. These advantages accrue while retaining the high speed operation required for present day computer circuits.

Turning now to Figure 1, a flip-flop generally indicated at 10 has Zero and One inputs 12 and 14, respectively, and Zero and One outputs 16 and 18. The Zero state may be imposed on flip-flop 10 by applying a positive going pulse to the Zero input 12, and this state will be indicated by an appropriate voltage level at the Zero output 16. Similarly, the One state may be imposed on the flip-flop by applying a similar signal to the One input 14. A complement circuit, generally indicated at 20, applies an input pulse to the Zero input 12 when flip-flop 10 is in the One state and to the One input 14 when the flip-flop is in the Zero state, whenever a pulse is received from a complement source indicated at 22. Accordingly, regardless of which state the flip-flop 10 is in, a complement pulse will always serve to transfer it to its other or complementary state.

More particularly, the circuit 20 comprises a transformer generally indicated at 24, with a primary 26, and a pair of secondaries 28 and 30. A pair of diodes 32 and 34 are connected between the respective secondaries and the Zero and One inputs 12 and 14. The conducting direction of each of the diodes for positive signals is toward its associated flip-flop input. Secondary 28 is connected to the One output 18 and secondary 30 to the Zero output 16.

In operation, whenever the flip-flop 10 is in the Zero state, the voltage level at the One output 18 is negative with respect to the Zero input 12, and therefore there is a reverse bias across the diode 32. Preferably, this bias is greater than the voltage of the positive-going complement pulse appearing across the secondary 28 in response to the application of a pulse to the primary 26 from the source 22. Accordingly, the complement pulse will not be passed by diode 32 to the Zero input 12. On the other hand, no such blocking voltage exists at the Zero output 16 connected to the secondary 30, and therefore the diode 34 will pass the complement pulse to the One input 14 with a consequent change from the Zero to the One state of the flip-flop 10. If the flip-flop is in the One state when the complement pulse is generated by the source 22, the diode 34 will be cut off by a negative voltage from the Zero output 16 and the diode 32 will pass the pulse to the Zero input 12 to change the state from One to Zero.

It will be apparent that the complement circuit 20 actually comprises two gating circuits, each of which includes a diode, a secondary of the transformer 24 and the primary 26. While it is convenient for the two gating circuits to share the same primary, this is not necessary, and the present invention contemplates the use of two separate transformers, with their primary windings connected to the source 22. Further, when separate primary windings are utilized, the diodes may, in many cases, be inserted in series with the primaries rather than the secondaries, with the control signals from the flip-flop output also connected to the primaries in a manner which will be apparent from the preceding description.

Turning now to Figure 2, it is seen that the flip-flop 10 may include a pair of p-n-p transistors 36 and 38 with emitters, bases and collectors denoted by the letters *a*, *b* and *c*, respectively. A negative supply voltage from a suitable source (not shown) is applied to the collectors **36*c* and 38*c* through resistors R1 and R2. The parallel combination of a resistor R3 and a capacitor C1 is connected between the base 36*b* and collector 38*c*, and similarly, resistor R4 and capacitor C2 are connected between base 38*b* and collector 36*c*. The emitters 36*a* and 38*a* are returned to the positive terminal of the power supply by a ground connection indicated at 40. In this circuit, the One output 18 is connected to the collector 36*c* and the Zero output 16 to the collector 38*c*. The Zero input 12 is connected to the base 36*b* and the One input 14 to the base 38*b*. A pair of diodes 42 and 44 are connected between terminals 46 and 48 and the Zero and One inputs 12 and 14, respectively. The Zero state may be defined to exist when transistor 38 is conducting between the emitter 38*a* and collector 38*c* and transistor 36 is cut off, i.e., nonconducting; in the One state, the reverse situation exists, i.e., transistor 36 conducting and transistor 38** cut off.

Flip-flop 10 operates in a well-known manner. Assuming it to be in the Zero state, transistor 38 will be saturated, i.e., the collector voltage will be almost at ground potential, and the effective emitter-collector resistance will be negligible. Base **36*b*, connected to collector 36*c* by way of the resistor R3, will be at the same potential, thereby cutting off transistor 36, and collector 36*c* will therefore have a negative potential. Base 38*b*, connected to collector 36*c* by resistor R4, will be slightly negative. If a positive-going pulse is then applied to terminal 48, it will be passed by diode 44 to the One input 14 and base 38*b*, thereby cutting off transistor 38. The voltage at the collector 38*c* then drops to a negative value as does the base 38*b* to render the transistor 36 conducting, and thereby transfer the flip-flop 10 to the One state. The reverse process will take place if a positive pulse is applied to the Zero input 12, imposing the Zero state on the flip-flop 10**.

When the flip-flop 10 is in the Zero state, the voltage at the Zero output 16 is approximately at ground level, and, accordingly, the diode 34 is free to conduct a pulse whose voltage exceeds in magnitude the slight negative potential of base **38*b*. On the other hand, the One output 18 is far more negative, thereby imposing a substantial reverse bias on the diode 32. Accordingly, a complement pulse from the source 22, appearing across the secondaries 28 and 30, will be passed to the One input 14 but blocked from the Zero input 12, and the flip-flop 10 will transfer from the Zero to the One state in the manner described. It will be apparent that if the flip-flop 10 is in the One state, the complement pulse will be passed to the Zero input 12, instead of the One input 14**, and the flip-flop will therefore change to the Zero state.

The source of the control or gating signal is in series with the load to which the gated complement pulse is delivered, and therefore it is desirable that, when the gated complement pulse is to be passed, the control source have a low internal impedance as compared with that of the load, so that almost the entire pulse voltage will be across the load, i.e., the base-emitter circuit of the transistor in parallel with resistor R1 or R2. In other words, substantially all of the pulse voltage should be between the base and emitter (ground) terminals of the transistor to which the pulse is passed. This condition is obtained in the circuit of Figure 2, since the conducting transistor which is to be cut off by the complement pulse is saturated, that is, it has an abundance of charge carriers at the collector, and therefore its effective emitter-to-collector impedance is low.

Thus, I have described a novel gating circuit utilizing easily-installed, low cost components, yet capable of the high speed operation exclusively associated with vacuum tube and transistor gates prior to my invention. In the preferred embodiment, the gating circuit comprises a transformer, one of whose windings is connected in series with a diode and the source of the gating or control signal. When the gating signal is absent, the diode conducts in its forward direction to permit the gated pulse current to pass through the winding with which the diode is associated, and the transformer thereby operates in its customary manner. When the gating signal is applied, however, a reverse bias voltage is placed across the diode, thereby blocking conduction therethrough and preventing current from passing through the associated transformer winding. Accordingly, passage of the gated pulse through the transformer is effectively blocked. Assuming proper transformer design, the circuit contains negligible reactance, and therefore there is essentially no delay, either in the opening and closing of the gate or in passage of the gated signal. I have also described the manner in which a pair of my gating circuits may be combined to form the complement input circuit for a conventional flip-flop.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

I claim:

1. A flip-flop having a pair of inputs and a pair of outputs, the voltages between said outputs and a common reference point reflecting the state of said flip-flop, the voltages between the inputs and said reference point determining the state of said flip-flop, said flip-flop including a complement input comprising a pair of gating circuits connected to the respective inputs, each of said gating circuits having a transformer secondary and a diode connected in series with said secondary between one of said inputs and one of said outputs, means for simultaneously exciting said secondaries upon the application of a complement pulse to said complement input, each diode being connected between an input and an output whose potentials are such as to cut off the diode when the arrival of a complement pulse at that input alone would not cause a change of state of said flip-flop and enable the diode to conduct when a complement pulse at that input would cause a change of state, whereby a pulse appearing across said windings may be conducted only to the proper input for causing a change of said state of said flip-flop.

2. The combination defined in claim 1 including a single transformer, said windings being secondary windings of said transformer, said transformer including a primary winding adapted for connection to a source of complement pulses.

3. The combination defined in claim 1 in which said diodes are adapted to conduct in the same direction with respect to said inputs and said windings have the same sense with respect to said diodes.

4. The combination defined in claim 3 in which said flip-flop comprises a pair of transistors having bases, emitters and collectors, each of said diodes and the winding to which it is connected being in series between the base and collector of one of said transistors.

5. A flip-flop circuit including provision for a complement function, said circuit comprising, in combination, a pair of transistors interconnected for flip-flop operation, an input and an output associated with each transistor, a diode and a transformer secondary connected in series between each of said inputs and one of said outputs, said flip-flop developing biasing voltages at said outputs sufficient to reverse bias one of said diodes in one condition of said flip-flop and the other of said diodes in the other condition thereof, each of said diodes being connected to conduct in the forward direction pulses which change the condition of said flip-flop when the other of said diodes is reverse biased, a complement pulse source, means coupling said source to said secondaries to induce therein pulses in the forward directions of said diodes, said complement source developing a voltage which induces in said secondaries pulses whose level is less than said reverse bias and at least as great as the level required to provide conduction in said diodes in the absence of said reverse bias.

6. The combination defined in claim 5 in which said transistors are connected in a common emitter circuit, said inputs being the bases of said transistors and the outputs the collectors thereof.

7. The combination defined in claim 5 in which each diode transformer secondary combination is connected between the collector and base of the same transistor.

8. A flip-flop circuit including provision for a complement function, said circuit comprising, in combination, a pair of transistors interconnected for flip-flop operation, the emitter of each of said transistors being connected to a common reference point, the base of each transistor being connected to the collector of the other transistor by means of the parallel combination of a resistor and coupling capacitor, a resistor connected between each collector and a power source having the proper polarity for emitter-collector conduction, a diode and a transformer secondary in series between the collector and base of each of said transistors, each diode being connected to conduct in a direction opposite to emitter-base conduction in the transistor to which it is connected, a complement pulse source and means coupling said complement pulse source to said transformer secondaries in such manner as to develop in each secondary a pulse whose polarity is in the forward direction of the diode connected to said secondary.

9. A flip-flop circuit including provision for a complement function, said circuit comprising, in combination, a pair of transistors interconnected for flip-flop operation, an input associated with each transistor, a source of voltage indicating the state of said flip-flop connected to each of said transistors, a diode and a transformer secondary connected in series between each of said inputs and one of said voltage sources, said sources developing biasing voltages sufficient to reverse-bias one of said diodes in one state of said flip-flop and the other of said diodes in the other state, each of said diodes being connected to conduct in the forward direction pulses which change the state of said flip-flop when the other of said diodes is reversed biased, and means for coupling a complement pulse source to said secondaries to induce therein pulses having the same polarity with respect to said diodes in response to a pulse from said complement source.

References Cited in the file of this patent

UNITED STATES PATENTS

| | | |
|---|---|---|
| 2,764,688 | Grayson et al. | Sept. 25, 1956 |
| 2,778,978 | Drew | Jan. 22, 1957 |
| 2,809,303 | Collins | Oct. 8, 1957 |
| 2,848,608 | Nienburg | Aug. 19, 1958 |
| 2,885,549 | Speller | May 5, 1959 |
| 2,903,606 | Curtis | Sept. 8, 1959 |
| 2,932,795 | Carroll | Apr. 12, 1960 |

UNITED STATES PATENT OFFICE
CERTIFICATE OF CORRECTION

Patent No. 2,977,485 March 28, 1961

Kenneth H. Olsen

It is hereby certified that error appears in the above numbered patent requiring correction and that the said Letters Patent should read as corrected below.

Column 6, line 12, for the claim reference numeral "5" read -- 6 --.

Signed and sealed this 26th day of September 1961.

(SEAL)
Attest:

ERNEST W. SWIDER
Attesting Officer

DAVID L. LADD
Commissioner of Patents

USCOMM-DC